United States Patent [19]
Wakefield et al.

[11] Patent Number: 4,602,120
[45] Date of Patent: Jul. 22, 1986

[54] SOLAR CELL MANUFACTURE

[75] Inventors: G. Felix Wakefield, Woodland Hills; Hyouk I. Yoo, Agoura, both of Calif.

[73] Assignee: Atlantic Richfield Company, Los Angeles, Calif.

[21] Appl. No.: 555,253

[22] Filed: Nov. 25, 1983

[51] Int. Cl.[4] .................. H01L 31/06; H01L 31/18
[52] U.S. Cl. .................. 136/256; 29/572; 136/255; 357/30; 357/65; 357/68; 427/88
[58] Field of Search .................. 29/572, 589, 591; 148/186, 187, 188, 189; 136/255, 256; 357/30, 65, 68; 427/88

[56] References Cited

U.S. PATENT DOCUMENTS

| | | | |
|---|---|---|---|
| 3,888,698 | 6/1975 | Lindmayer et al. | 136/256 |
| 4,106,047 | 8/1978 | Lindmayer | 136/255 |
| 4,158,591 | 6/1979 | Avery et al. | 156/643 |

FOREIGN PATENT DOCUMENTS

| | | | |
|---|---|---|---|
| 1455903 | 11/1976 | United Kingdom | 136/256 |
| 230993 | 11/1968 | U.S.S.R. | 136/256 |

Primary Examiner—Aaron Weisstuch
Attorney, Agent, or Firm—Albert C. Metrailer

[57] ABSTRACT

An improved solar cell, and method for manufacture, in which a back side reverse p-n junction is formed prior to metallization and a gridded back side metallization material, chosen so that it penetrates the p-n junction where it is present, is fired into the wafer. The finished solar cell has improved efficiency despite the presence of the reverse p-n junction over a majority of the back face surface.

8 Claims, 5 Drawing Figures

SOLAR CELL MANUFACTURE

BACKGROUND OF THE INVENTION

The present invention relates to improved methods for manufacturing photovoltaic solar cells and particularly to improvements which result in a back contact structure which increases cell efficiency.

The most relevant reference known to the applicants is U.S. Pat. No. 4,158,591 issued to Avery et al. on June 19, 1979, which patent is hereby incorporated by reference for all purposes. The Avery patent teaches the desirability of forming a shallow p-n junction, the steps involved in manufacturing such a device, and various problems related thereto. In general, the Avery reference is directed toward simplifying the manufacturing process to thereby reduce the final cost of the manufactured devices. One of the primary simplifications taught by Avery involves the destruction of back face p-n junctions which may be formed either intentionally or accidentally during the formation of the front face p-n junction. The back face junction is a reverse biased diode junction which would interfere with flow of current from the active front face junction to the back surface contact. Instead of using a separate step, such as etching, to remove the back surface junction, Avery teaches the use of a back surface metallization containing a material, such as aluminum, which upon firing will alloy through the junction to make ohmic contact with the bulk material of the semiconductor wafer. Avery teaches the use of a continuous back contact metallization which covers substantially the entire back surface of the wafer, thereby destroying substantially all of the back surface p-n junction.

The use of a continuous or full coverage back contact has been standard practice because of resistance considerations. Typically, the bulk material of the semiconductor wafer has a higher resistivity than the thin diffused front layer. Therefore there would be far more loss occurring if current had to travel laterally through the bulk material to reach the rear contact than occurs on the front surface contacts to the thin diffused layer which must be in the form of some type of grid pattern to allow the majority of the light to reach the active junction.

More recently it has been determined that the use of a gridded back contact would lower the operating temperature of the solar cells and thereby improve their efficiency. This is because infrared radiation tends to pass through the solar cell and either be absorbed by a full back surface contact or reflected back through the device. In either case, the absorption of infrared radiation results in higher cell operating temperature which reduces cell efficiency. By proper design of a gridded back contact, it has been found that a net efficiency increase can be achieved through operating temperature reduction even when back contact resistance is taken into account.

The use of a gridded back contact metallization has several effects on the cost of manufacturing solar cells. The gridded contact uses much less metal paste than the solid back contact and therefore significally reduces material costs. However, when a gridded back contact has been used, additional steps have been employed to insure that no reverse junction exists on the back surface of the semiconductor wafer prior to the metallization step. The above referenced Avery patent discusses various prior art techniques used to avoid such reverse junctions. The junction destruction technique taught by Avery has not been thought applicable to the gridded back configuration since only that small part of the reverse junction area covered by the gridded contact pattern would be destroyed upon the firing operation.

SUMMARY OF THE INVENTION

Surprisingly, we have found that it is not necessary to either remove or alloy through the entire reverse back junction of a solar cell when a gridded back contact metallization is used. Even more surprising is our finding that the presence of a p-n junction on the unmetallized portions of the back face of a solar cell actually improves performance of the cells.

In accordance with the present invention, an active impurity, or dopant, of an opposite conductivity imparting type is introduced into the back face of the semiconductor wafer, preferably at the same time that the dopant is introduced into the front face of the same wafer to generate the active junction. Back contact metallization in the form of a grid pattern is then deposited on the back surface of the semiconductor wafer, with the metallization selected to penetrate or alloy through the back p-n junction upon firing. The wafer is then heated to an appropriate temperature to fuse the back contact metallization and cause it to alloy into the semiconductor wafer to at least the depth of the p-n junction. The resulting back contact therefore includes a grid of metallization in ohmic contact with the bulk material of the semiconductor wafer with a p-n junction remaining in all unmetallized semiconductor surfaces of the back face.

Accordingly, an object of this invention is to provide an improved photovoltaic solar cell structure and process for manufacturing same.

Another object of the present invention is to provide a simplified process for manufacturing photovoltaic solar cells having a gridded back contact pattern and a reduced contact resistance.

BRIEF DESCRIPTION OF THE DRAWINGS

The present invention may be better understood by reading the following detailed description of the preferred embodiment with reference to the accompanying drawings wherein.

DESCRIPTION OF THE PREFERRED EMBODIMENT

Figure 1:
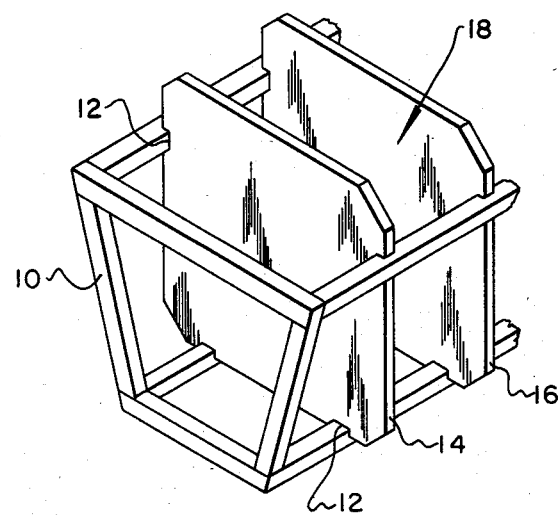
FIG. 1 is a perspective view of a plurality of individually spaced apart semiconductor wafers assembled in a diffusion boat.

With reference now to FIG. 1, there is illustrated a typical diffusion boat 10 constructed, for example, of quartz. The boat 10 has a plurality of slots 12 formed in the sides and bottom thereof to hold a plurality of semiconductor wafers in an upright spaced apart position. Boat 10 is typically sized to carry a large number of wafers, for example, twenty-five, but only two wafers 14 and 16 are illustrated to simplify the drawings. A space 18, somewhat exaggerated for the purposes of the illustration, is provided to allow uniform circulation of diffusion gases on all sides of the wafers 14, 16, etc. Wafers 14 and 16 are typically cut from a single crystal silicon boule containing a p type dopant such as a boron impurity. After the boat 10 with wafers 14, 16, etc. is placed in a diffusion furnace and heated to an appropriate temperature, a gaseous source of a n type impurity such as phosphorous is flowed through the furnace to contact all exposed surfaces of the silicon wafers to thereby introduce an n type impurity into all exposed surfaces.

Figure 2:
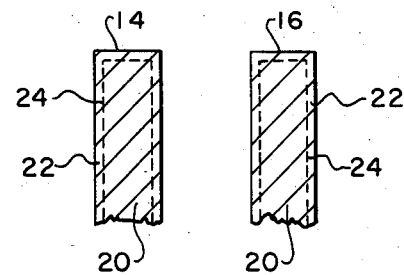
FIG. 2 is a cross-sectional view of a portion of a pair of semiconductor wafers after the diffusion process.

FIG. 2 is a cross-sectional illustration of the edges of wafers 14 and 16 after the diffusion process. The bulk of the silicon material illustrated at 20 is still of p type conductivity, having been unaffected by the diffusion process. A very thin outer layer 22, typically no more than 0.3 micrometers thick, has been converted to n type conductivity by the phosphorous dopant. As a result, a p-n junction illustrated by the dotted lines 24 has been generated at a depth of about 0.3 micrometers below all exposed semiconductor surfaces. Since the thickness of wafers 14 and 16 is typically 300 microns, it can be seen that the illustrated depth of the junction is greatly exaggerated. Due to the close proximity of the junctions 24 to the various wafer surfaces they are often referred to as being located on or at the particular surface in question.

As described in the above description of the prior art, a functional solar cell requires the existence of a p-n junction 24 on only one face, which is typically the light receiving face of the cell. As can be seen from the description of the preferred embodiment to this point there is actually no difference between the front and back faces or surfaces of the wafers 14 and 16. This is a distinct advantage in a production environment since no harm results from accidentally turning cells over on the production line. It is however necessary, as taught in the above referenced Avery patent, for the back side metallization to be in ohmic contact with the bulk material 20. However, contrary to the teachings of the prior art, it is not necessary that the entire p-n junction 24 existing on the back side of the finished cell be destroyed. In fact we have found it is preferable for the majority of the back side junction to remain intact.

Figure 3:
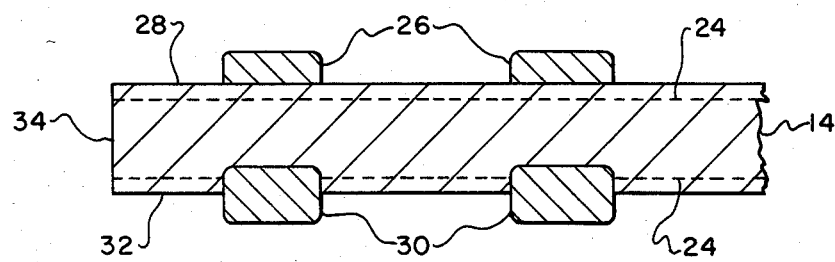
FIG. 3 is a cross-sectional view of a portion of a semiconductor wafer after front and back metallization has been applied and fired.

In FIG. 3 is provided a cross-sectional view of semiconductor wafer 14 after front and back metallization have been applied and fired. The front and back contact metallization patterns will be described in more detail below with reference to FIGS. 4 and 5. In FIG. 3 front contact metallization 26 is illustrated by an end on view of two metallization lines positioned on a surface 28 which at this point has been selected as the front face of the solar cell. In similar fashion back contact metallization 30 has also been illustrated as an end on view of two metallization lines which have been fired into the back surface 32 of the solar cell. The metallization pastes used to generate conductors 26 and 30 may be essentially identical, consisting primarily of silver, except that the paste used for the back contact metal 30 contains a small amount, for example 2 percent by weight, of aluminum. Other materials such as those disclosed in the Avery patent may likewise be added to the back contact metallization 30. By addition of the aluminum, or other material which will alloy with silicon, the back contact metallization 30 alloys into the wafer 14 to a depth sufficient to penetrate the p-n junction 24 on the back face 32. The front face metallization 26, which contains no such materials, merely forms an ohmic contact to the front face 28 without disturbing the p-n junction 24 on the front face. The metallization lines 26 and 30 are in practice spaced considerably farther apart than illustrated so that typically only 5 to 20 percent of the surface area is covered by metallization. In addition it is desirable that, as illustrated, the back metallization 30 be aligned with the front face metallization 26. In this way the maximum amount of infrared radiation entering the solar cell through front face 28 is allowed to exit the back face 32 without absorption or reflection by the back side metallization.

As also illustrated in FIG. 3, the p-n junction previously existing on the edge 34 of wafer 14 has been removed to eliminate shorting which would otherwise occur through the n type layer existing on the edge as illustrated in FIG. 2. The edge junction is preferably removed by the plasma etching technique described in the above referenced Avery patent.

Figure 4:
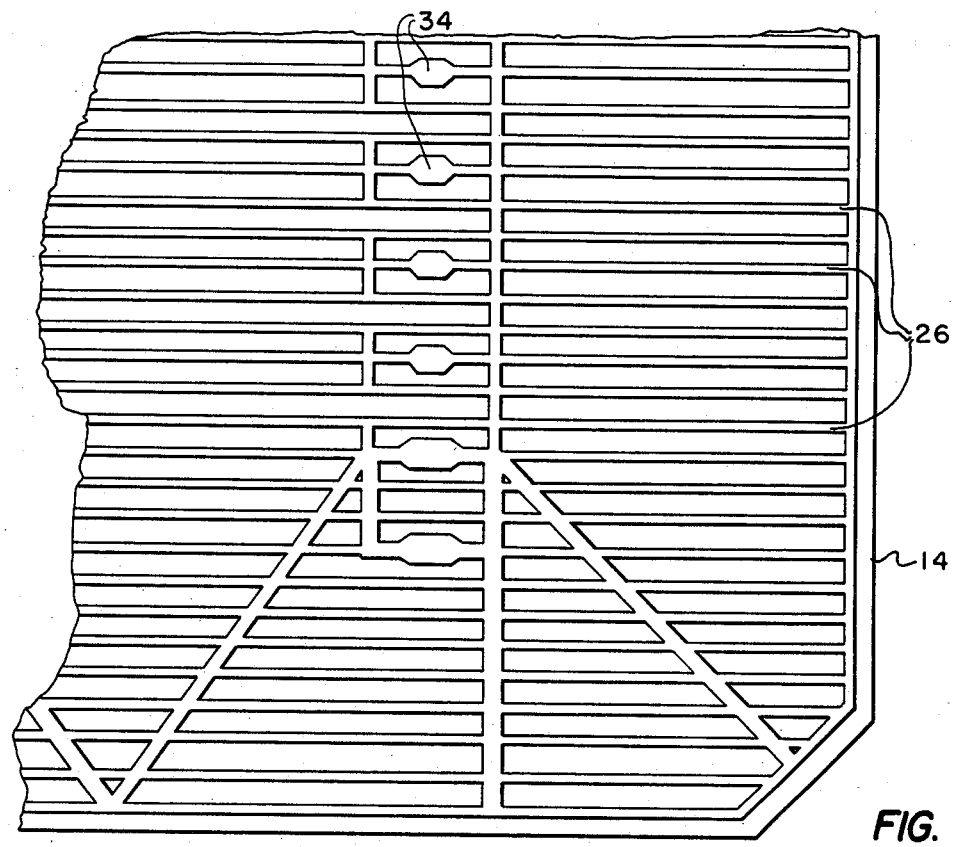
FIG. 4 is a plan view of a corner of a solar cell illustrating a front contact metallization pattern; and, FIG. 5 is a plan view of a corner of a solar cell illustrating a gridded back contact metal pattern according to the present invention.

With reference now to FIG. 4, there is illustrated approximately one-quarter of a front contact metallization pattern used in solar cells made according to the present invention. The cell 14 is a nominal four inch square cell with actual dimensions of about 3.825 inches square except for the corner cutoffs as illustrated. The metal pattern illustrated includes various current collection conductors 26 such as those which were illustrated in FIG. 3. In addition a number of solder pads 34 are provided for connecting external leads. As illustrated, the pads 34 are provided in a line over which a strip conductor may be positioned and spot soldered to the pads 34. The complete pattern includes two sets of these solder pads 34. Current collector lines 26 may typically be from 0.003 to 0.012 inches wide and may be spaced approximately 0.04 to 0.2 inches apart.

Figure 5:
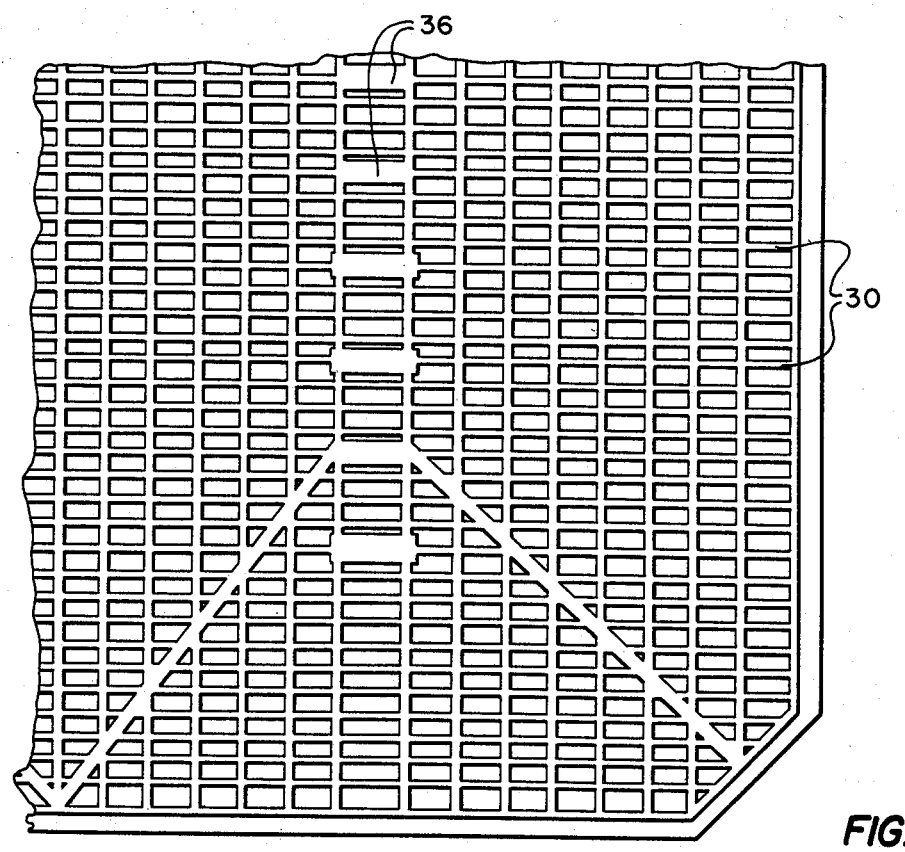

In similar fashion, FIG. 5 illustrates the gridded back contact pattern of the preferred embodiment. This pattern contains numerous current collection conductors 30 such as those illustrated in FIG. 3. A row of solder pads 36 is also illustrated for use in connecting external leads. In a typical solar module, strip conductors attached to solder pads 36 extend on to the front face of an adjacent solar cell to be soldered to the solder pads 34 such as illustrated in FIG. 4. Current collectors 30 again may vary in width from 0.003 inch to 0.012 inch and may be spaced 0.04 to 0.2 inches apart and cover less than fifty percent of the back face 32.

A metal paste formulation found suitable for the back contact metallization pattern of FIG. 5 is as follows:
silver powder—about 73% by weight
aluminum powder—about 2% by weight
borosilicate glass frit—about 4% by weight
butyl carbitol or terpineol (solvent)—about 16% by weight
ethyl cellulose (organic binder)—about 5% by weight Substantially the same composition, with the exception that the aluminum powder is totally eliminated, has provided suitable results for use as the front contact metallization. This material is used to screen print the desired patterns such as illustrated in FIGS. 4 and 5 on the front and back surfaces of the solar cell. A printed thickness of about 0.0005 inch has been found to work well. After appropriate drying, the front and rear contacts can then be fired concurrently in an open tube belt furnace by running the cell through the furnace, for example, for a period of about three seconds at a temperature of 640° to 645° Centigrade.

Depending upon the precise line width and spacing dimensions used, the back side of the finished solar cell will have typically five to twenty percent (in any case less than fifty percent) of its surface area covered by metallization. As illustrated, where such metallization is present the back side p-n junction has been alloyed through and thereby destroyed. However, in the remaining 80 to 95 percent of the back surface silicon area, the p-n junction 24 will still be present. We have found in a production environment that the resulting cells provide significantly better performance as compared to cells fabricated with a solid back side metallization.

The improved performance of cells fabricated according to the present invention is illustrated by the data of Table 1. This Table has six power brackets into which cells were sorted by automatic test equipment. Each listed power level is the lower end of a 0.05 watt range of levels. For example, the bracket listed as 1.037 watt includes all cells having power levels between 1.037 watt and 1.087 watt. During the test, cells were illuminated with 100 milliwat per square centimeter of sunlight equivalent, which is a standard test condition known as AM 1.5. The cells were maintained at 25° C. during testing, thereby eliminating the effect of lower operating temperature, which is expected to improve the performance of cells with a gridded back. Power was measured by holding cell test voltage at 0.494 volt while measuring output current.

The column labeled "Solid Back %" indicates the results of testing a single lot of cells having a solid back side metallization. These cells were manufactured in a normal production run in which eighty-four cells reached this final test stage. The back side metallization was applied in two steps. In the first a silver paste, such as described above, was used to print solder pads similar to pads 36 of FIG. 5. After the pads were dried, a paste containing only aluminum as a metal component was printed over the remaining back side surface. The aluminum paste was printed to a thickness of about 0.0015 inch to achieve a sheet resistivity less than that of the silver paste of the present invention.

The column labeled "Gridded Back %" indicates the combined results of testing four lots containing a total of 824 cells fabricated according to the present invention. These cells were fabricated and tested within two weeks of the solid back cells using the same production equipment.

TABLE 1

| CELL POWER DISTRIBUTION | | |
|---|---|---|
| POWER, W | SOLID BACK, % | GRIDDED BACK % |
| 1.235 | 0 | 12.7 |
| 1.186 | 0 | 24.6 |
| 1.136 | 14.6 | 22.0 |
| 1.087 | 18.2 | 13.6 |
| 1.037 | 25.5 | 26.9 |
| 0.988 | 41.6 | 0 |

A comparison of the second and third columns of Table 1 shows the substantial improvement in performance achieved by the present invention. For example, while none of the solid back cells provided an output power above 1.186 watt, 37.3% of the gridded back cells did. Likewise, 41.6% of the solid back cells had an output power below 1.037 watt while none of the gridded back cells were below this level.

The substantial increase in power output was achieved while eliminating one screen printing and drying step from the fabrication process. In addition, the total metal paste cost per watt of cell capacity produced was substantially reduced, despite replacement of relatively inexpensive aluminum paste with silver paste. This cost reduction is due to the substantial reduction in area covered by paste, reduction in paste thickness, and increase in power produced per cell.

While the present invention has been illustrated and described with reference to particular production methods and resulting solar cell structures, various modifications and changes can be made therein within the scope of the present invention as defined by the appended claims.

What is claimed is:

1. In a method for manufacturing solar cells wherein an active impurity of an opposite conductivity imparting type is introduced into both major faces of a semiconductor wafer to establish p-n junctions, and back contacts are formed by metallization using a material chosen so that it penetrates any p-n junction to form a low resistance ohmic contact through any such junction, the improvement comprising:
applying said material in a gridded pattern covering no more than 50% of the back face of said wafer, whereby at least 50% of said p-n junction on said back face remains after formation of said ohmic contact.

2. A solar cell having an improved back face contact formed by the process of:
  (a) introducing an active impurity of an opposite conductivity imparting type into the back face of a semiconductor wafer to establish a p-n junction therein;
  (b) applying a metallization material in a gridded pattern covering no more than 50% of the back face, said material being chosen so that upon firing it penetrates said p-n junction; and
  (c) firing said wafer with said material to cause said metallization to penetrate said p-n junction and form a low resistance ohmic contact to the bulk of said wafer,
whereby at least 50% of said back face p-n junction remains in the finished device.

3. A solar cell according to claim 2 wherein during step (a) the same active impurity is introduced into the front face of said semiconductor wafer to establish an active p-n junction therein.

4. A solar cell according to claim 2 wherein, prior to step (c), metallization material is applied to the front face of said wafer and said front face metallization is fired during step (c) to form a front face ohmic contact.

5. A solar cell comprising:
a semiconductor wafer having a light receiving face and a back face,
an active p-n junction formed on the light receiving face,
first conductor means on and in electrical contact with said light receiving face,
a reverse p-n junction formed on the back face of said wafer,
second conductor means on the back face of said wafer and alloyed through said reverse p-n junction and in ohmic contact with the bulk of said wafer, said second conductor means in the form of a grid pattern covering less than fifty percent of said back face.

6. A solar cell according to claim 5 wherein said second conductor means covers from five to twenty percent of said back face.

7. A solar cell according to claim 5 wherein said second conductor means includes aluminum.

8. A solar cell according to claim 7 wherein said second conductor means includes about two percent by weight aluminum.

* * * * *